United States Patent [19]

Kakimoto

[11] Patent Number: 5,617,439
[45] Date of Patent: Apr. 1, 1997

[54] SEMICONDUCTOR LASER DEVICE AND SEMICONDUCTOR LASER ARRAY DEVICE

[75] Inventor: Syoichi Kakimoto, Itami, Japan

[73] Assignee: Mitsubishi Denki Kabushiki Kaisha, Tokyo, Japan

[21] Appl. No.: 536,124

[22] Filed: Sep. 29, 1995

[30] Foreign Application Priority Data

Jun. 10, 1994 [JP] Japan .................................. 6-242971

[51] Int. Cl.⁶ ...................................................... H01S 3/19
[52] U.S. Cl. ............................... 372/50; 257/84; 257/85; 385/49; 385/88
[58] Field of Search ................................ 372/50; 385/49, 385/88; 257/84, 85

[56] References Cited

U.S. PATENT DOCUMENTS

| | | | |
|---|---|---|---|
| 4,470,143 | 9/1984 | Kitamura et al. | 372/50 |
| 5,032,879 | 7/1991 | Buchmann et al. | 372/50 |
| 5,175,781 | 12/1992 | Hockaday et al. | 385/49 |
| 5,258,991 | 11/1993 | Peterson | 372/48 |
| 5,355,386 | 10/1994 | Rothman et al. | 257/84 |

FOREIGN PATENT DOCUMENTS

| | | |
|---|---|---|
| 0410067 | 1/1991 | European Pat. Off. . |
| 2274740 | 8/1994 | United Kingdom . |

*Primary Examiner*—Rodney B. Bovernick
*Assistant Examiner*—Luong-Quyen T. Phan
*Attorney, Agent, or Firm*—Leydig, Voit & Mayer

[57] ABSTRACT

A semiconductor laser device includes a semiconductor laser having a pair of facets and disposed on a semiconductor substrate and a photodiode having a light responsive surface on which a laser beam emitted from one of the facets of the semiconductor laser is incident, also disposed on the semiconductor substrate. The pair of facets of the semiconductor laser and the light responsive surface of the photodiode are both perpendicular to the surface of the semiconductor substrate, and the light responsive surface of the photodiode is disposed so that light of the laser beam reflected by the light responsive surface does not return to the emitting point of the laser beam. Therefore, return light noise generated in the semiconductor laser is avoided. In addition, the pair of facets of the semiconductor laser and the light responsive surface of the photodiode can be formed simultaneously by dry etching, thereby shortening the fabricating process.

7 Claims, 11 Drawing Sheets

5,617,439

1

SEMICONDUCTOR LASER DEVICE AND SEMICONDUCTOR LASER ARRAY DEVICE

FIELD OF THE INVENTION

The present invention relates to a semiconductor laser device and a semiconductor laser array device and, more particularly, to a semiconductor laser device and a semiconductor laser array device in which a semiconductor laser and a photodiode having a light responsive surface on which the laser beam emitted from the semiconductor laser is incident are disposed on a same semiconductor substrate so that the light reflected by the light responsive surface of the photodiode does not return to the emitting point of the laser beam. Furthermore, this invention relates to a semiconductor laser device and a semiconductor laser array device in which a groove for positioning an optical fiber or an optical waveguide on which the laser beam emitted from the semiconductor laser device is incident is present on the semiconductor substrate on which the semiconductor laser device is disposed.

BACKGROUND OF THE INVENTION

FIG. 9 is a perspective view illustrating a prior art photodiode integrated short resonator length semiconductor laser device conceived from the structure described in *Electronics Letters*, volume 18, pages 189–190 (1982). In FIG. 9, reference numeral 1 designates a semiconductor substrate. A semiconductor laser 2 is disposed on the semiconductor substrate 1. The semiconductor laser 2 has a front side laser beam emitting facet 3 which includes a front side laser beam emitting point 4. The semiconductor laser 2 has also a rear side laser beam emitting facet 5 which includes a rear side laser beam emitting point 6. Reference numeral 7 designates an upper surface electrode of the semiconductor laser 2 and numeral 8 designates a bonding pad of the upper surface electrode 7. A photodiode 9 that monitors the laser beam emitted from the rear side laser beam emitting point 6 is disposed on the semiconductor substrate 1. The photodiode 9 has a light responsive surface 10 that includes a light responsive point 10a. Reference numeral 11 designates an upper surface electrode of the photodiode 9 and numeral 12 designates a lower surface electrode common to the semiconductor laser 2 and the photodiode 9.

In this prior art example, the length of the semiconductor laser 2, i.e., the resonator length L is short, for example, 20 μm, and it is difficult to bond the upper surface electrode 7 onto the semiconductor laser 2. Therefore, a bonding pad 8 is connected with the upper surface electrode 7 of the semiconductor laser 2 that is disposed beside the semiconductor laser 2. The photodiode 9 is disposed at a position where the light responsive surface 10 is opposed to the rear side laser beam emitting facet 5 as shown in FIG. 9.

The front side laser beam emitting facet 3 and the rear side laser beam emitting facet 5, a pair of reflecting mirror surfaces of the semiconductor laser 2, are formed perpendicular to the surface of the substrate 1 by a dry etching process such as RIE (reactive ion etching) or RIBE (reactive ion beam etching).

The laser beam emitted from the laser beam emitting point 6 of the rear side laser beam emitting facet 5 is incident on the photodiode light responsive surface 10 to generate a monitor signal at the photodiode 9. In addition, a portion of the laser beam incident on the light responsive surface 10 of

2 the photodiode 9 is reflected by the light responsive surface 10.

When the light responsive surface 10 of the photodiode 9 is perpendicular to the surface of the substrate 1, a portion of the laser beam reflected by the light responsive surface 10 returns to the rear side laser beam emitting point 6, and induces return light noise in the semiconductor laser 2. In the *Electronic Letters* publication, in order to avoid this problem, the light responsive surface 10 of the photodiode 9 is not perpendicular to the substrate 1 but is inclined with respect to the substrate 1.

FIG. 10 is a diagram illustrating a semiconductor laser array device in which a semiconductor laser array comprising a plurality of semiconductor lasers arranged in an array and a photodiode array comprising a plurality of photodiodes arranged in an array, each of which monitors the laser beam emitted from one facet of one of the semiconductor lasers, are disposed on the same semiconductor substrate parallel to each other.

In FIG. 10, the same reference numerals as in FIG. 9 designate the same or corresponding parts. Reference numeral 20 designates a semiconductor laser array disposed on the substrate 1, numerals 21a and 21b designate semiconductor lasers forming the semiconductor laser array 20, numeral 22 designates a front side laser beam emitting facet of the semiconductor laser array, numerals 23a and 23b designate front side laser beam emitting points of the semiconductor lasers 21a and 21b, respectively, numeral 24 designates a rear side laser beam emitting facet of the semiconductor laser array, and numerals 25a and 25b designate rear side laser beam emitting points of the semiconductor lasers 21a and 21b, respectively. Reference numeral 30 designates a photodiode array disposed on the substrate 1. Reference numerals 31a and 31b designate photodiodes, each of which corresponds to one of the semiconductor lasers 21a and 21b and monitors the laser beam emitted from the corresponding rear side laser beam emitting points 25a and 25b of the semiconductor lasers 21a and 21b, and forming the photodiode array 30. Reference numerals 32a and 32b designate light responsive surfaces of respective photodiodes 31a and 31b, respectively.

A description is given of the operation of a semiconductor laser and photodiode pair. The laser beam emitted from the rear side laser beam emitting point 25a of the semiconductor laser 21a is incident on the light responsive surface 32a of the photodiode 31a which corresponds to the semiconductor laser 21a and generates a monitor signal in the photodiode 31a.

FIG. 11 shows a manner of coupling between a semiconductor laser device and an optical fiber according to the prior art. In FIG. 11, the same reference numerals as in FIG. 9 designate the same or corresponding parts. Reference numerals 41 and 42 designate lenses and numeral 43 designates an optical fiber. The lenses 41 and 42, and the optical fiber 43 are accurately positioned so that a reduction in the coupling efficiency when the laser beam emitted from the front side laser beam emitting point 4 of the semiconductor laser 2 is introduced into the optical fiber 43 is prevented.

The laser beam emitted from the rear side laser beam emitting point 4 of the semiconductor laser 2 is first incident on the lens 41, whereby it becomes a parallel light beam. Then, the parallel light beam is incident on the lens 42 and collimated and the collimated laser beam is incident on the optical fiber 43.

The prior art photodiode integrated semiconductor laser device constructed as described above has the following problems. Initially, in the semiconductor laser device shown in FIG. 9, the light responsive surface 10 of the photodiode 9 is inclined with respect to the surface of the substrate 1, not perpendicular to the surface of the substrate 1. Therefore, the light responsive surface 10 of the photodiode 9 cannot be produced at the same time as the front side laser beam emitting facet 3 and the rear side laser beam emitting facet 5, that are perpendicular to the surface of the substrate 1. Therefore, it was necessary to produce the facets in a separate process.

As a method for forming a surface having an inclination with respect to the surface of the substrate 1 as the light responsive surface 10 of the photodiode 9, a surface that is perpendicular to the surface of the substrate 1 may be formed using the same method used in forming the front side laser beam emitting facet 3 and the rear side laser beam emitting facet 5. Thereafter, by FIB (focused ion beam) or wet etching, only the light responsive surface 10 of the photodiode 9 is made to incline. However, these methods require separate processes.

In the semiconductor laser array device shown in FIG. 10, the laser beam emitted from the rear side laser beam emitting point 25a of the semiconductor laser 21a is to be received only by the light responsive portion 32a of the corresponding photodiode 31a and monitored, and, similarly, the laser beam emitted from the rear side laser beam emitting point 25b of the semiconductor laser 21b is to be received only by the corresponding light responsive portion 32b of the photodiode 31b and monitored. However, crosstalk arises in which a portion of the laser beam emitted from the rear side laser beam emitting point 25b of the semiconductor laser 21b is received by the light responsive surface 32a of the photodiode 31a and monitored.

In order to suppress crosstalk, the separation between respective photodiodes arranged in an array may be increased. However, the degree of integration in the photodiode array is then reduced.

In the semiconductor laser device shown in FIG. 11, in order to couple the laser beam emitted from the front side laser beam emitting point 4 of the semiconductor laser 2 efficiently to the optical fiber 43, it is required to position the lens 41, the lens 42, and the optical fiber 43 accurately, which is troublesome work.

SUMMARY OF THE INVENTION

It is an object of the present invention to provide a semiconductor laser device in which a semiconductor laser having a pair of facets and a photodiode, which does not reflect the laser beam emitted from the semiconductor laser to be incident on the light emitting point of the laser and that has a light responsive surface that can be produced at the same time as the laser beam emitting facet of the semiconductor laser, are disposed on the same substrate.

It is another object of the present invention to provide a semiconductor laser array device in which semiconductor lasers, each having a pair of facets and photodiodes, none of which reflects the laser beam emitted from the semiconductor laser to be incident on the light emitting point of the laser and has a light responsive surface that can be produced at the same time as the laser beam emitting facet of the semiconductor laser, are disposed on the same substrate.

It is still another object of the present invention to provide a semiconductor laser array device in which crosstalk is avoided and in which the laser beam emitted from a semiconductor laser is received by photodiodes other than the corresponding photodiode.

It is a further object of the present invention to provide a semiconductor laser device and a semiconductor laser array device on which an optical fiber or an optical waveguide can be easily and accurately positioned so that the laser beam emitted from the front side laser beam emitting facet of one of the semiconductor lasers is incident on the fiber or waveguide.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor laser device includes a semiconductor laser having a pair of facets and disposed on a semiconductor substrate, and a photodiode having a light responsive surface on which a laser beam emitted from one of the pair of facets is incident, disposed on the semiconductor substrate. The pair of facets and the light responsive surface are perpendicular to the surface of the semiconductor substrate, and the light responsive surface of the photodiode is disposed so that the reflected light does not return to the emitting point of the laser beam. Therefore, no return light noise is generated in the semiconductor laser. In addition, the pair of facets of the semiconductor laser and the light responsive surface of the photodiode can be formed at the same time by dry etching, shortening the fabricating process.

According to a second aspect of the present invention, the light responsive surface of the photodiode is disposed in a plane parallel to the optical axis of the laser beam within the broadening angle of the emitted laser beam in the plane. Therefore, the laser beam that is reflected by the light responsive surface of the photodiode does not return to the light emitting point of the laser beam so that no noise is generated in the semiconductor laser. In addition, the pair of facets of the semiconductor laser and the light responsive surface of the photodiode can be formed at the same time by dry etching, shortening the fabricating process.

According to a third aspect of the present invention, a groove that passes the laser beam emitted from one of the pair of facets is disposed on the substrate with a pair of sides parallel to the optical axis of the laser beam. The light responsive surface of the photodiode is disposed on one of the pair of sides of the groove. Therefore, the laser beam reflected by the light responsive surface of the photodiode does not return to the light emitting point of the laser beam and no return light noise is generated in the semiconductor laser. In addition, the pair of facets of the semiconductor laser and the light responsive surface of the photodiode can be formed at the same time by dry etching, shortening the fabricating process.

According to a fourth aspect of the present invention, in a semiconductor laser array device, a plurality of semiconductor laser devices are arranged in a line on the semiconductor substrate so that the optical axes of the laser beams emitted from the respective semiconductor laser devices are in the same direction. In the respective semiconductor laser devices, the laser beam reflected by the light responsive surface of a photodiode does not return to the light emitting point of the laser beam and no return light noise is generated in the semiconductor laser. In addition, the pair of facets of the semiconductor laser and the light responsive surface of the photodiode can be formed at the same time by dry etching, shortening the fabricating process.

Furthermore, the light responsive surface of the particular photodiode among the photodiodes constituting the semiconductor laser array device is interrupted by the substrate at the opposite sides of the groove at which the particular light responsive surface is provided so that there is no crosstalk. Therefore, the separation between the respective photodiodes can be narrowed, resulting in a semiconductor laser array device having an increased degree of integration.

According to a fifth aspect of the present invention, in the semiconductor laser device, the photodiode has a light responsive surface opposite the facet from which a laser beam is emitted, and the light responsive surface has a configuration that does not reflect the laser beam emitted from the corresponding semiconductor laser to the light emitting point of the corresponding semiconductor laser. Therefore, no return light noise is generated in the semiconductor laser. In addition, the pair of facets of the semiconductor laser and the light receiving facet of the photodiode can be formed at the same time by dry etching, shortening the fabricating process. Furthermore, because the light responsive surface of the photodiode is opposite the facet of the corresponding semiconductor laser that emits the laser beam, it can effectively receive the laser beam.

According to a sixth aspect of the present invention, the light responsive surface of the photodiode has a concave configuration and the point on the light responsive surface most distant from the facet that emits the laser beam is shifted from the optical axis of the laser beam. Therefore, the laser beam reflected by the light responsive surface of the photodiode does not return to the light emitting point of the laser beam and no return light noise is generated in the semiconductor laser. In addition, the pair of facets of the semiconductor laser and the light responsive surface of the photodiode can be formed at the same time by dry etching, shortening the fabricating process. Furthermore, because the light responsive surface of the photodiode is opposite the facet of the corresponding semiconductor laser that emits the laser beam, it can effectively receive the laser beam.

According to a seventh aspect of the present invention, in a semiconductor laser array device, a plurality of semiconductor laser devices are arranged in a line so that the optical axes of the laser beams emitted from the respective semiconductor laser devices are in the same direction on the semiconductor substrate. Therefore, in the respective semiconductor laser devices, the laser beam reflected by the light responsive surface of the photodiode does not return to the light emitting point of the laser beam and no return light noise is generated in the semiconductor laser. In addition, the pair of facets of the semiconductor laser and the light responsive surface of the photodiode can be formed at the same time by dry etching, shortening the fabricating process. Furthermore, because the light responsive surfaces of the respective photodiodes constituting the semiconductor laser array device are opposite the facets of the corresponding semiconductor lasers that emit the laser beams, they can effectively receive the laser beams.

In addition, the light responsive surface of the respective photodiodes constituting the semiconductor laser array device is interrupted by the substrate portion at the periphery of the groove of the opposite light responsive surface and laser beam emitting facet so that there is no crosstalk. Therefore, the separation between the respective photodiodes can be narrowed, resulting in a semiconductor laser array device having an increased degree of integration.

According to an eighth aspect of the present invention, a groove for positioning an optical fiber or optical waveguide on which a laser beam emitted from the other of the pair of facets is incident is formed on the semiconductor substrate on which the semiconductor laser device is formed. Therefore, an optical fiber or optical waveguide can be easily and accurately positioned on the substrate.

According to a ninth aspect of the present invention, the groove for positioning has a width narrower than the radius of the optical fiber or the width of the optical waveguide in the vicinity of the laser beam emitting facet of the semiconductor laser and has a width wider than the radius of the optical fiber or the width of the optical waveguide at a position remote from the light emitting facet of the laser beam. Therefore, an optical fiber or optical waveguide can be easily and accurately positioned on the substrate and a tip portion of the optical fiber or optical waveguide is prevented from directly contacting and damaging the laser beam emitting facet of the semiconductor laser.

DETAILED DESCRIPTION OF THE PREFERRED EMBODIMENTS

Embodiment 1

Figure 1:
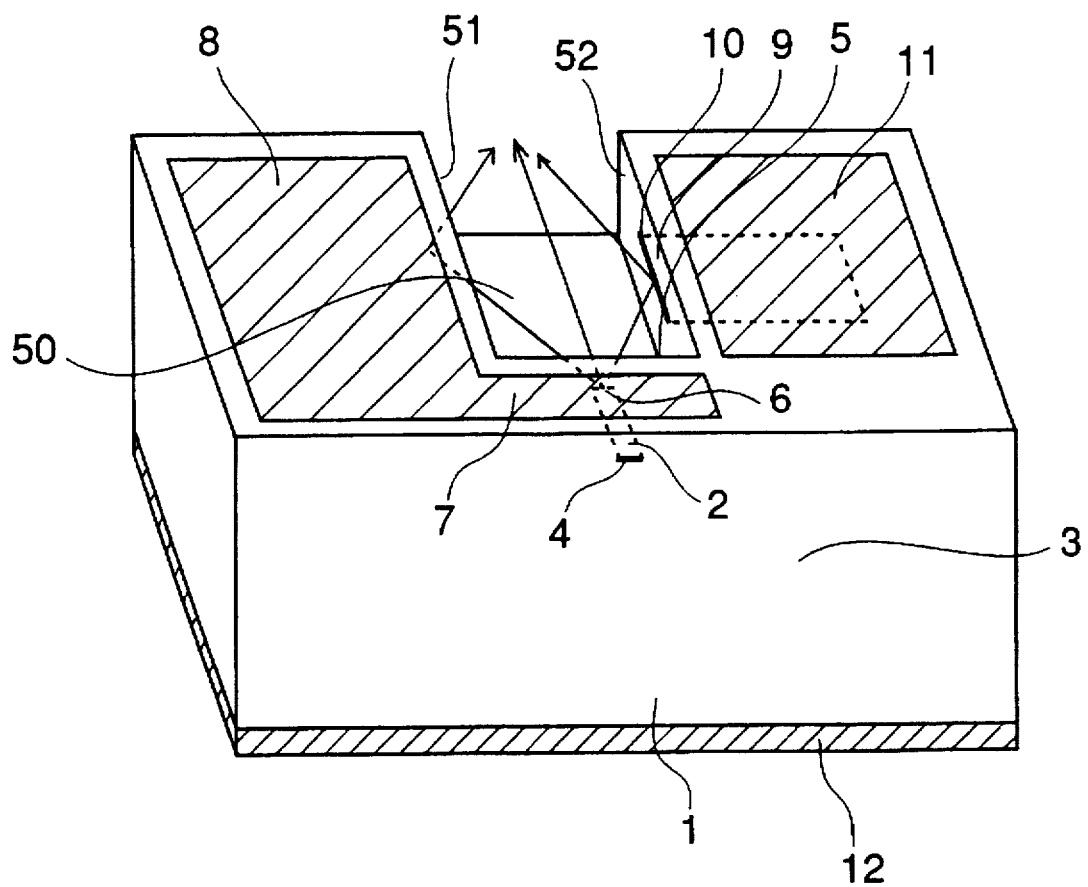
FIG. 1 is a perspective view illustrating a semiconductor laser device according to a first embodiment of the present invention.
Figure 9:
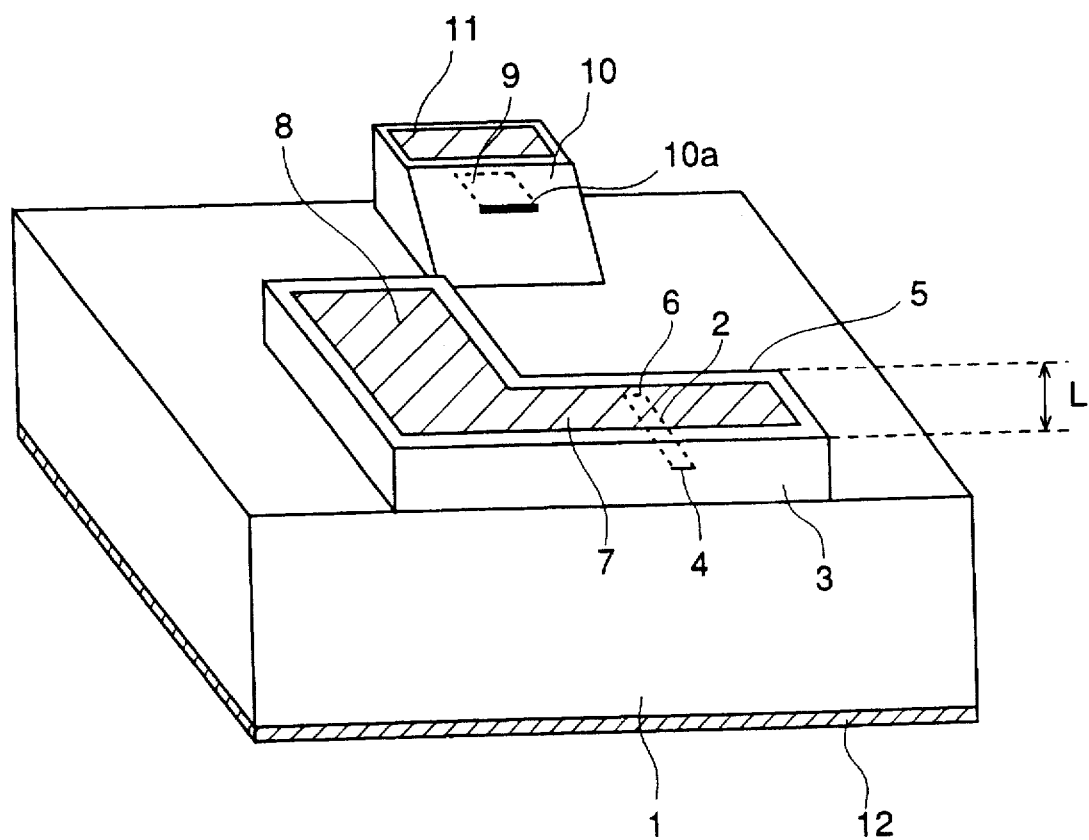
FIG. 9 is a perspective view illustrating a prior art photodiode integrated semiconductor laser device.
Figure 10:
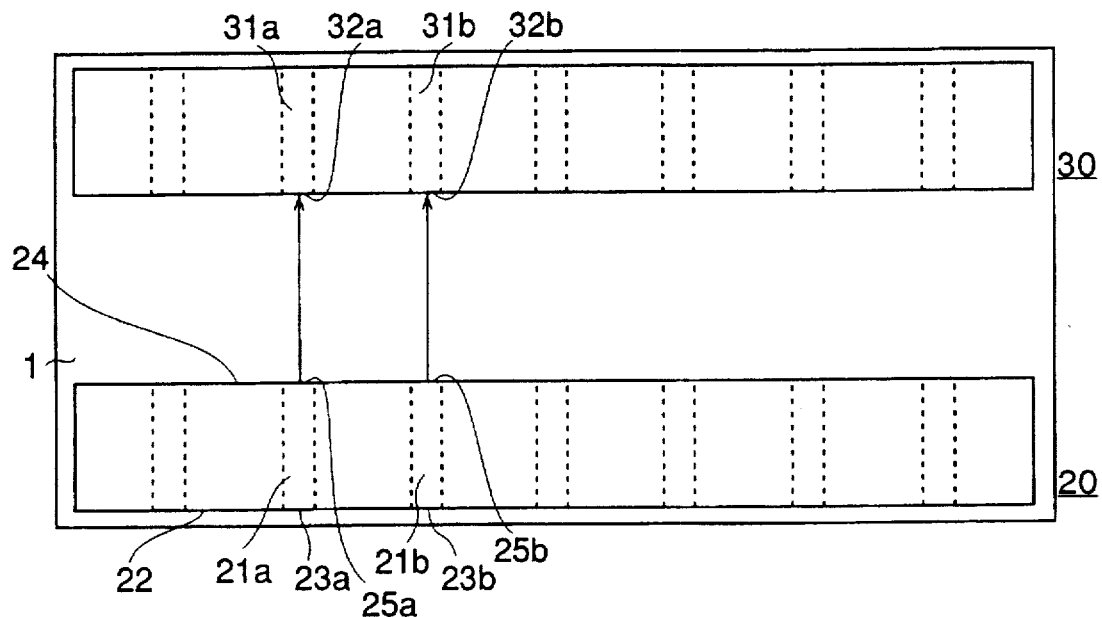
FIG. 10 is a diagram illustrating a semiconductor laser array and a photodiode array according to the prior art.
Figure 11:
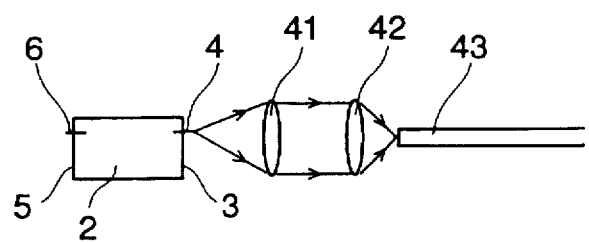
FIG. 11 is a diagram illustrating a manner of coupling a semiconductor laser device to an optical fiber or an optical waveguide according to the prior art.
Figure 12:
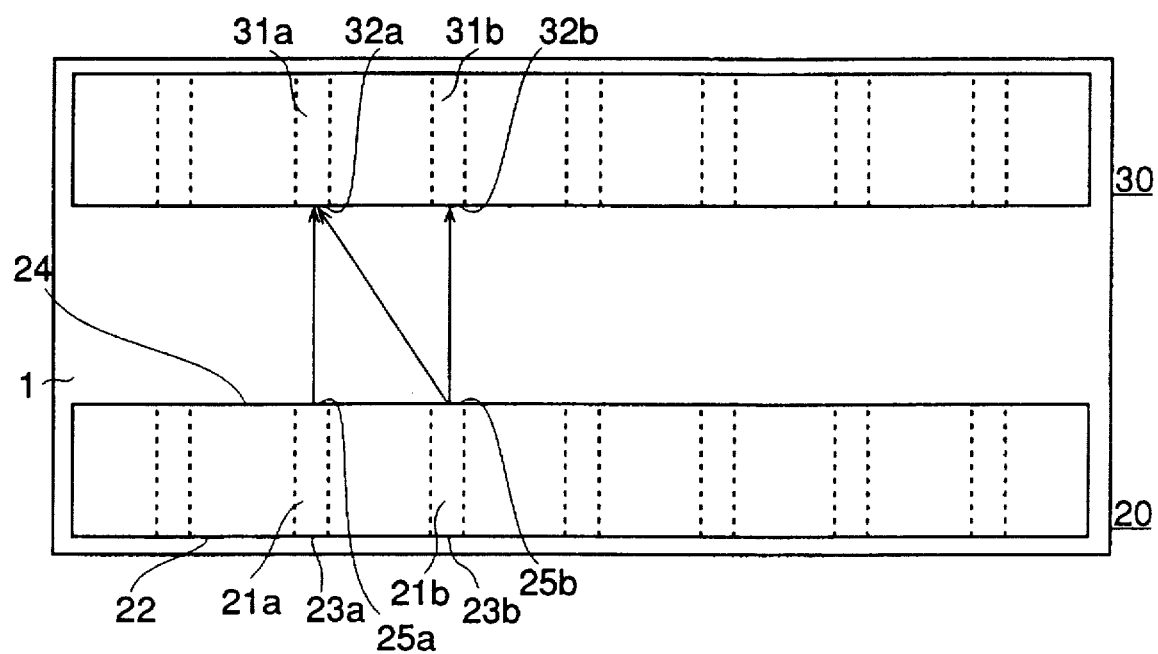
FIG. 12 is a diagram illustrating the occurrence of crosstalk in a semiconductor laser array and a photodiode array according to the prior art.

FIG. 1 is a perspective view illustrating a semiconductor laser device according to a first embodiment of the present invention, which is obtained by applying the present invention to a short resonator length semiconductor laser device. In FIG. 1, the same reference numerals as in FIG. 9 designate the same or corresponding parts. Reference numeral 50 designates a groove that passes the laser beam emitted from the rear side laser beam emitting facet 5. Reference numerals 51 and 52 designate sides of the groove 50.

In this embodiment, a semiconductor laser 2 is disposed on the substrate 1, and the front side laser beam emitting facet 3 and the rear side laser beam emitting facet 5, a pair of reflecting mirror surfaces, are perpendicular to the surface of the substrate 1. The groove 50 that passes the laser beam emitted from the rear side laser beam emitting facet 5 is aligned along the laser beam emitting direction, with a pair of sides 51 and 52 parallel to the optical axis of the laser beam and perpendicular to the surface of the substrate 1. On one of the sides 51 of the groove 50, the light responsive surface 10 of the photodiode 9 monitoring the laser beam is located within the broadening angle of the laser beam. Since the broadening angle of the laser beam is ten plus several degrees in the horizontal direction, if the width of the groove 50 is 20 μm and the length thereof is 300 μm, sides of the groove that are 100 μm apart from the rear side laser beam emitting facet 5 are present within the broadening angle of the laser beam.

The laser beam that is emitted from the rear side laser beam emitting facet 5 of the semiconductor laser 2 broadens in the horizontal direction by ten plus several degrees in traveling along the optical axis, and is incident on the light responsive surface 10 of the photodiode provided at the side 52 of the groove 50, thereby generating a monitor current in the photodiode 9. A portion of the laser beam incident on the light responsive surface 10 of the photodiode is reflected by the light responsive surface 10. However, since the light responsive surface 10 is parallel to the optical axis of the laser beam that is emitted from the rear side laser beam emitting facet 5, a portion of the laser beam incident on the light responsive surface 10 is reflected to a direction that is remote from the rear side laser beam emitting facet 5. Therefore, the laser beam reflected by the light responsive surface 10 of the photodiode does not return to the rear side laser beam emitting point 6, so that the laser beam reflected by the light responsive surface 10 of the photodiode does not induce return light noise in the semiconductor laser 2.

In the semiconductor laser device according to this embodiment, the semiconductor laser 2 having the front side laser beam emitting facet 3 and the rear side laser beam emitting facet 5 and the photodiode 9 having the light responsive surface 10 on which the laser beam emitted from the rear side laser beam emitting facet 5 is incident are disposed on the semiconductor substrate 1. In addition, the groove 50 is provided on the substrate 1 with the pair of sides 51 and 52 parallel to the optical axis of the laser beam, and the light responsive surface 10 of the photodiode is provided on one side 52 of the groove 50 within the broadening angle of the emitted laser beam. Therefore, the laser beam emitted from the rear side laser beam emitting facet 5 does not return to the rear side laser beam emitting point 6 even when it is reflected by the light responsive surface 10 of the photodiode and, consequently, the laser beam reflected by the light responsive surface 10 of the photodiode does not induce return light noise in the semiconductor laser 2. Furthermore, since the front side laser beam emitting facet 3, the rear side light emitting facet 5, and the light responsive surface 10 of the photodiode are respectively perpendicular to the surface of the substrate 1, they can be formed simultaneously by a dry etching process such as RIE (reactive ion etching) or RIBE (reactive ion beam etching), shortening the fabricating process.

While in the embodiment described above the light responsive surface 10 of the photodiode is provided at one side 52 of the groove 50, the light responsive surface 10 of the photodiode may be provided on any surface that is perpendicular to the surface of the substrate 1 within the broadening angle of the laser beam and parallel to the optical axis of the emitted laser beam.

Embodiment 2

Figure 2:
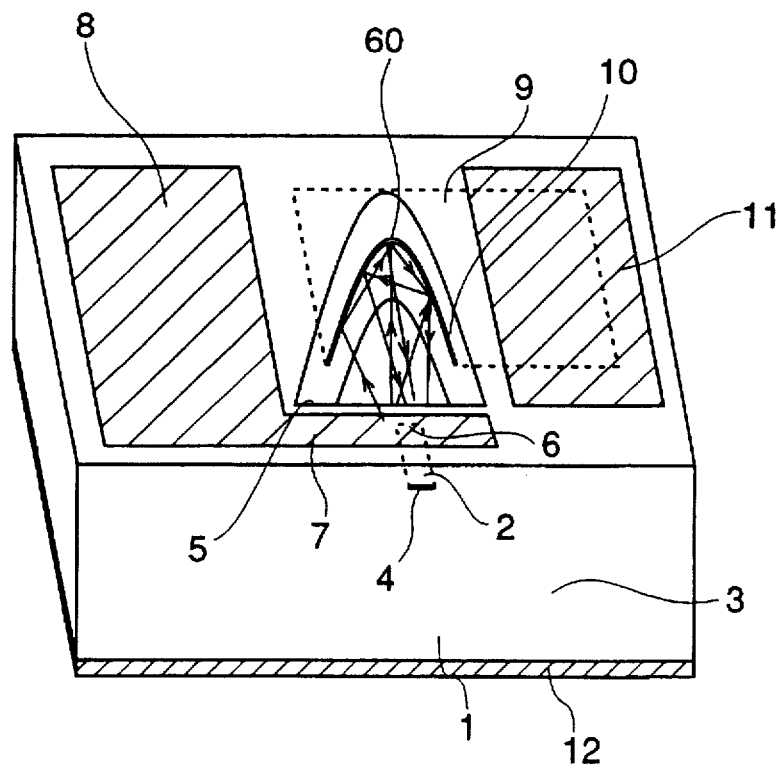
FIGS. 2(a) and 2(b) are a perspective view illustrating a semiconductor laser device according to a second embodiment of the present invention and a top view thereof.
Figure 2:
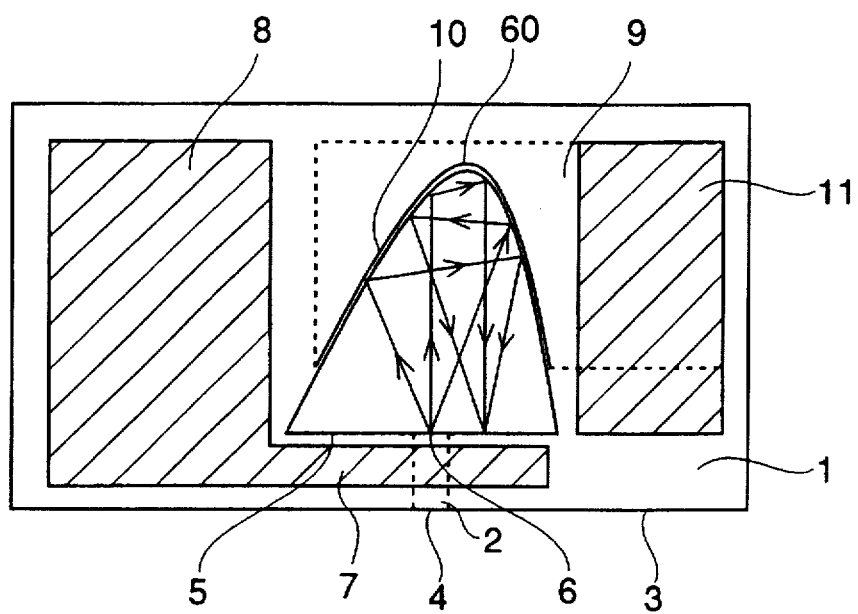

FIG. 2(*a*) is a perspective view illustrating a semiconductor laser device according to a second embodiment of the present invention and FIG. 2(*b*) is a top view thereof. In FIGS. 2(*a*) and 2(*b*), the same reference numerals as in FIG. 9 designate the same or corresponding parts, where reference numeral 60 designates a point on the light responsive surface 10 of the photodiode most distant from the rear side laser beam emitting facet 5.

In the second embodiment, a semiconductor laser 2 is disposed on the substrate 1, and the front side laser beam emitting facet 3 and the rear side laser beam emitting facet 5 as the pair of the reflecting mirror surfaces of the semiconductor laser 2 are perpendicular to the surface of the substrate 1. In the direction for emitting the laser beam of the rear side laser beam emitting facet 5, a light responsive surface 10 of the photodiode 9 for monitoring the laser beam that is emitted from the rear side laser beam emitting facet 5 is provided at a portion corresponding to the laser beam emitting facet 5, perpendicular to the surface of the substrate 1.

The light responsive surface 10 of the photodiode is concave in shape, and the point 60 on the light responsive surface 10 most distant from the laser beam emitting facet 5 is shifted from the optical axis of the laser beam.

In this second embodiment, the width of the rear side laser beam emitting facet 5 is 100 μm and the distance between the rear side laser beam emitting facet 5 and the point 60 most distant from the facet 5 is 150 μm. The point 60 is shifted by several microns from the optical axis of the emitted laser beam.

The laser beam emitted from the rear side laser beam emitting facet 5 of the semiconductor laser 2 is broadened in the horizontal direction by ten plus several degrees in traveling along the optical axis, and is incident on the light responsive surface 10 of the photodiode 9 at the portion opposite to the laser beam emitting facet 5, thereby generating a monitor current in the photodiode 9. A portion of the laser beam incident on the light responsive surface 10 of the photodiode is reflected by the light responsive surface 10. However, the light responsive surface 10 is concave, and the point 60 on the light responsive surface 10 most distant from the laser beam emitting facet 5 is shifted from the optical axis of the laser beam. Therefore, the laser beam reflected by the light responsive surface 10 at least one time returns to a point shifted from the rear side laser beam emitting point 6, so that the laser beam reflected by the light responsive surface 10 of the photodiode does not induce return light noise in the semiconductor laser 2.

In the semiconductor laser device according to this embodiment, the semiconductor laser 2, having the front side laser beam emitting facet 3 and the rear side laser beam emitting facet 5, and the photodiode 9, having the light responsive surface 10 on which the laser beam emitted from the rear side laser beam emitting facet 5 is incident, are disposed on the semiconductor substrate 1. In addition, the photodiode 9 has the light responsive surface 10 at the portion opposite the laser beam emitting facet 5, and the light responsive surface 10 of the photodiode is concave in shape and the point 60 on the light responsive surface 10 most distant from the laser beam emitting facet 5 is shifted from the optical axis of the laser beam. Therefore, the laser beam which is emitted from the rear side laser beam emitting facet 5 and is reflected by the light responsive surface 10 of the photodiode does not return to the rear side laser beam emitting point 6, and, therefore, the laser beam reflected by the light responsive surface 10 of the photodiode does not induce return light noise in the semiconductor laser 2. Furthermore, since the front side laser beam emitting facet 3, the rear side light emitting facet 5, and the light responsive surface 10 of the photodiode are respectively perpendicular to the surface of the substrate 1, they can be formed simultaneously by a dry etching process such as RIE (reactive ion etching) or RIBE (reactive ion beam etching), shortening the fabricating process.

According to the second embodiment, since the light responsive surface 10 of the photodiode monitoring the laser beam emitted from the rear side laser beam emitting facet 5 is opposed to the laser beam emitting facet 5, a plurality of laser beams emitted from the rear side laser beam emitting facet 5 are effectively received by the light responsive surface 10 of the photodiode.

While in FIGS. 2(a) and 2(b) the laser beam reflected by the light responsive surface 10 is focused on the rear side laser beam emitting facet 5, it is required that the laser beam reflected by the light responsive surface 10 and returned to the rear side laser beam emitting facet 5 be shifted from the rear side laser beam emitting point 6, and it is not always necessary to focus the laser beam on the rear side laser beam emitting facet 5.

In addition, while in the second embodiment the width of the rear side laser beam emitting facet 5 is 100 μm, the separation between the rear side laser beam emitting facet 5 and the point 60 most distant from the facet 5 is 150 μm, and the point 60 is shifted by several microns from the optical axis of the emitted laser beam, these values are not restricted to those described.

Embodiment 3

Figure 3:
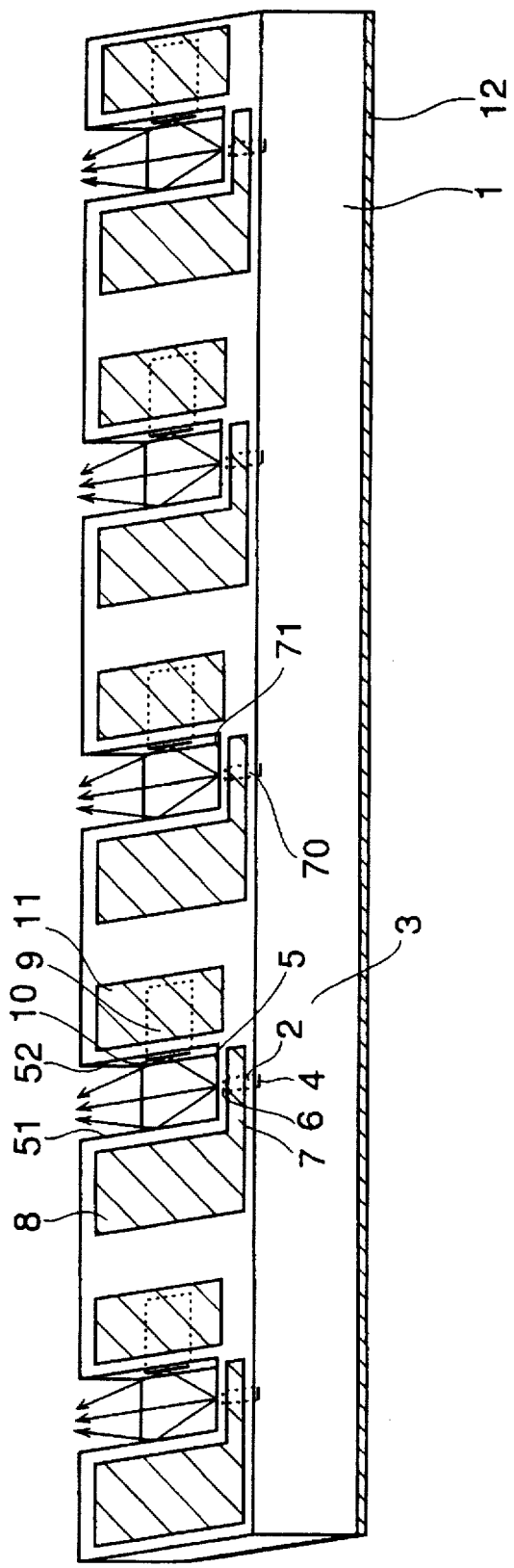
FIG. 3 is a perspective view illustrating a semiconductor laser array device according to a third embodiment of the present invention.

FIG. 3 is a perspective view illustrating a semiconductor laser array device according to a third embodiment of the present invention. In FIG. 3, the same reference numerals as in FIG. 1 designate the same or corresponding parts. Reference numeral 70 designates a semiconductor laser adjacent to the semiconductor laser 2 and numeral 71 designates a rear side laser beam emitting facet of the semiconductor laser 70.

The semiconductor laser array device of this embodiment comprises a plurality of semiconductor laser devices as described in the first embodiment of the invention arranged in an array so that the optical axes of the laser beams emitted from the respective semiconductor laser devices are in the same direction on the semiconductor substrate 1.

A description is given of the operation of the respective semiconductor laser devices with reference to one of the plurality of semiconductor laser devices constituting the semiconductor laser array.

The laser beam emitted from the rear side laser beam emitting facet 5 of the semiconductor laser 2 is broadened in the horizontal direction by ten plus several degrees in traveling along the optical axis, and is incident on the light responsive surface 10 of the photodiode provided at one side 52 of the groove 50, thereby generating a monitor current in the photodiode 9. Then, a portion of the laser beam incident on the light responsive surface 10 of the photodiode is reflected by the light responsive surface 10. However, since the light responsive surface 10 is parallel to the optical axis of the laser beam emitted from the rear side laser beam emitting facet 5, a portion of the laser beam incident on the light responsive surface 10 is reflected to a direction remote from the rear side laser beam emitting facet 5. Therefore, the laser beam reflected by the light responsive surface 10 of the photodiode does not return to the rear side laser beam emitting point 6, so that the laser beam does not induce return light noise in the semiconductor laser 2.

The relationship of the respective semiconductor laser devices constituting the semiconductor laser array will be explained with reference to two adjacent semiconductor laser devices. Since the light responsive surface 10 interrupts the laser beam emitted from the rear side laser beam emitting facet of a laser other than the semiconductor laser 2 corresponding to the photodiode 9 (for example, the rear side laser beam emitting facet 71 of the semiconductor laser 70 adjacent to the semiconductor laser 2), at the substrate portion including the photodiode 9 having the opposite sides 51 and 52 of a groove, there is no crosstalk in which a portion of the laser beam emitted from the rear side laser beam emitting facet 71 of the semiconductor laser 70 is received by the light responsive surface 10 of the photodiode 9.

According to the third embodiment, since a plurality of semiconductor laser devices as described for the first embodiment of the invention are arranged in an array so that the optical axes of the laser beams emitted from the respective semiconductor laser devices are in the same direction on the semiconductor substrate 1, there is no crosstalk in which a laser beam that is emitted from the adjacent rear side laser beam emitting facet is received by the photodiode. Therefore, the separation between the respective photodiodes can be narrowed, resulting in a semiconductor laser array device having an increased degree of integration.

Embodiment 4

Figure 4:
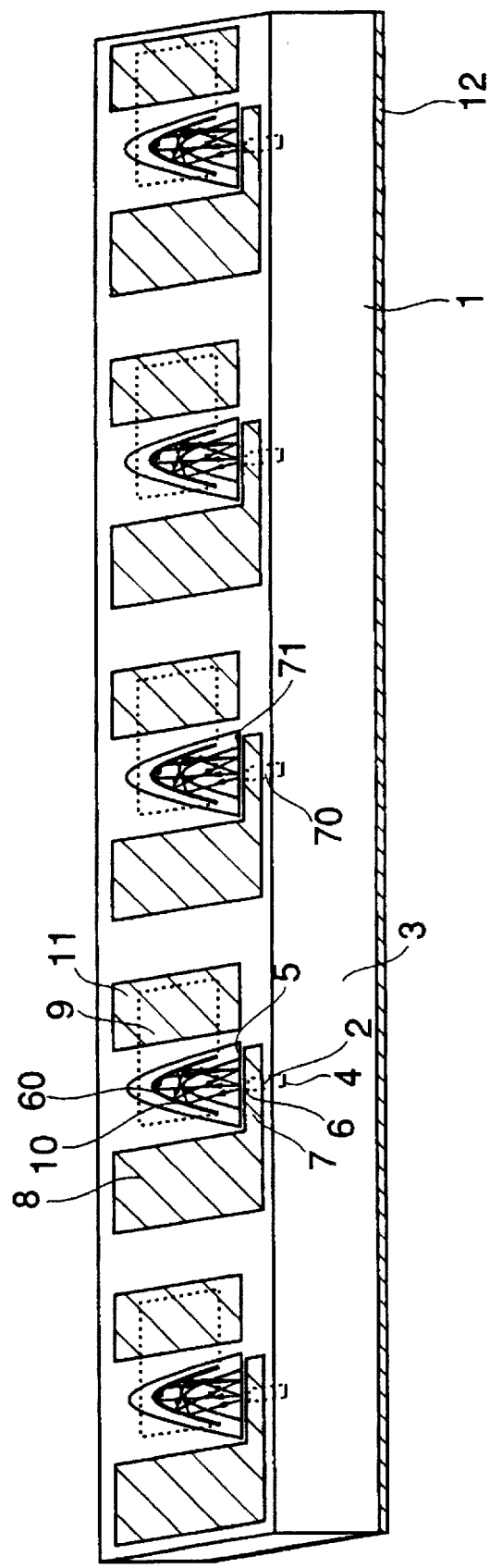
FIG. 4 is a perspective view illustrating a semiconductor laser array device according to a fourth embodiment of the present invention.

FIG. 4 is a perspective view illustrating a semiconductor laser array device according to a fourth embodiment of the present invention. In FIG. 4, the same reference numerals as in FIGS. 1 and 3 designate the same or corresponding parts.

The semiconductor laser array device of this embodiment comprises a plurality of semiconductor laser devices described as the second embodiment of the invention arranged in an array so that the optical axes of the laser beams emitted from the respective semiconductor laser devices are in the same direction on the semiconductor substrate 1.

A description is given of the operation of the respective semiconductor laser devices with reference to one of the plurality of semiconductor laser devices constituting the semiconductor laser array.

The laser beam emitted from the rear side laser beam emitting facet 5 of the semiconductor laser 2 is broadened in the horizontal direction by ten plus several degrees in traveling along the optical axis, and is incident on the light responsive surface 10 of the photodiode provided at the portion opposite the laser beam emitting facet 5, thereby generating a monitor current in the photodiode 9. Then, a portion of the laser beam incident on the light responsive surface 10 of the photodiode is reflected by the light responsive surface 10. However, since the light responsive surface 10 is concave and the point 60 on the light responsive surface 10 most distant from the laser beam emitting facet 5 is shifted from the optical axis of the laser beam, the laser beam reflected at least one time by the light responsive surface 10 returns to a point shifted from the rear side laser beam emitting point 6, so that the laser beam does not induce return light noise in the semiconductor laser 2.

Since the light responsive surface 10 interrupts the laser beam emitted from the rear side laser beam emitting facet (for example, the facet 71) of the laser, other than the semiconductor laser 2 corresponding to the photodiode 9, at the substrate portion at the periphery of the groove formed by the opposite light responsive surface 10 and rear side laser beam emitting facet 5, there is no crosstalk in which a portion of the laser beam emitted from the rear side laser beam emitting facet 71 of the semiconductor laser 70 is received by the light responsive surface 10 of the photodiode 9. According to the fourth embodiment, since a plurality of semiconductor laser devices described as the second embodiment of the invention are arranged in an array so that the optical axes of the laser beams emitted from the respective semiconductor laser devices are in the same direction on the semiconductor substrate 1, no crosstalk in which the laser beam emitted from the adjacent rear side laser beam emitting facet is received by the photodiode occurs. Therefore, the separation between the respective photodiodes can be narrowed, resulting in a semiconductor laser array device having an increased degree of integration.

Embodiment 5

Figure 5:
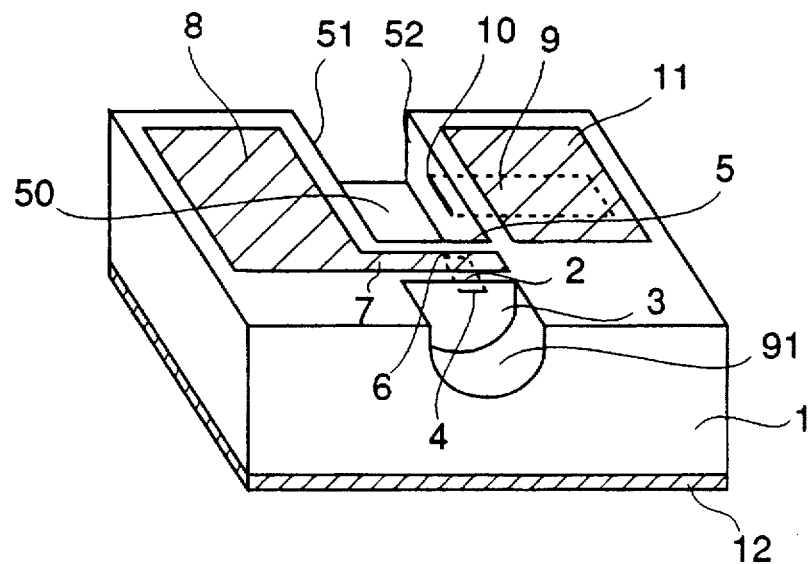
FIGS. 5(a) and 5(b) are a perspective view illustrating a semiconductor laser device according to a fifth embodiment of the present invention and a top view thereof.
Figure 5:
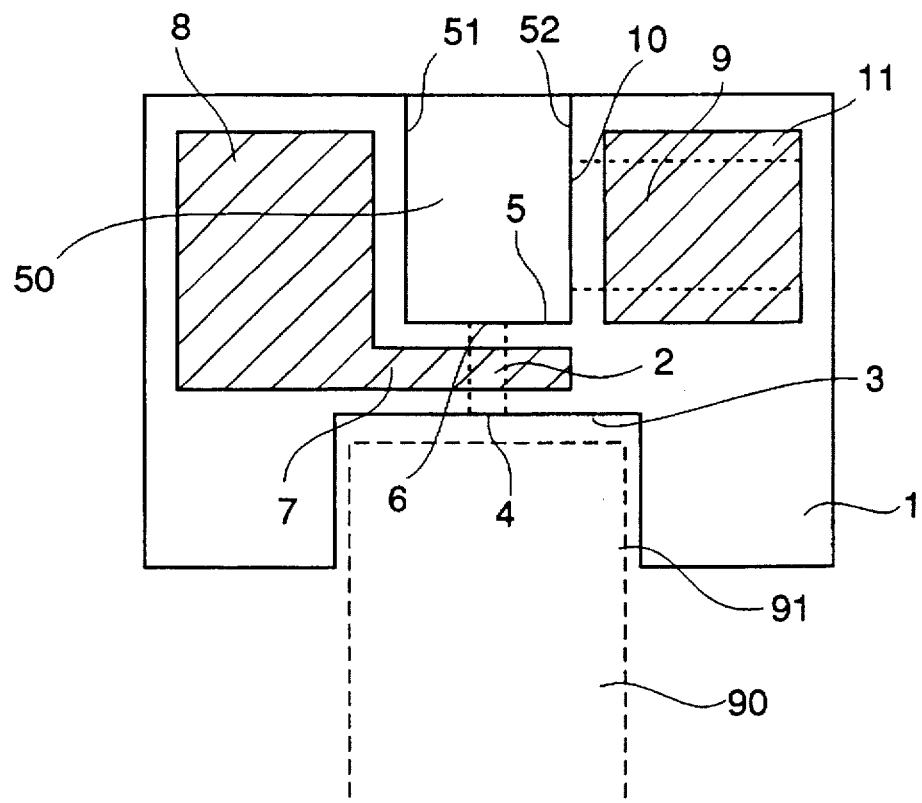

FIG. 5(a) is a perspective view illustrating a semiconductor laser device according to a fifth embodiment of the present invention and FIG. 5(b) is a top view thereof. In FIGS. 5(a) and 5(b), the same reference numerals as in FIG. 1 designate the same or corresponding parts. Reference numeral 90 designates an optical fiber or optical waveguide on which the laser beam emitted from the front side laser beam emitting facet is incident and numeral 91 designates a groove for positioning the optical fiber or optical waveguide on the substrate 1.

In this fifth embodiment, the semiconductor laser device according to the first embodiment and the groove 91 for positioning the optical fiber or optical waveguide 90 on which the laser beam emitted from the front side laser beam emitting facet 3 of the semiconductor laser device is incident are on the same substrate 1. The width of the groove 91 is approximately equal to an outer diameter of the optical fiber or a width of an optical waveguide positioned in the groove 91. For example, when positioning a fiber having a spherical tip, the width is about 60–70 μm. That optical fiber or optical waveguide is arranged along the groove 91 and it is fixed in the groove 91 with solder.

Since the groove 91 is formed by processing the substrate 1 that forms the semiconductor laser 2, positioning of the semiconductor laser 2 in the groove 91 is accurate and positioning of the optical fiber or optical waveguide 90 relative to the semiconductor laser 2 is also easily and accurately performed.

According to the fifth embodiment, the semiconductor laser device described as the first embodiment and the groove 91 for positioning the optical fiber or optical waveguide 90 on which the laser beam emitted from the front side laser beam emitting facet 3 of the laser device is incident, are on the same substrate 1. Therefore, the optical fiber or optical waveguide 90 is easily and accurately positioned on the substrate 1 in addition to the advantages achieved in the first embodiment of the invention.

Figure 6:
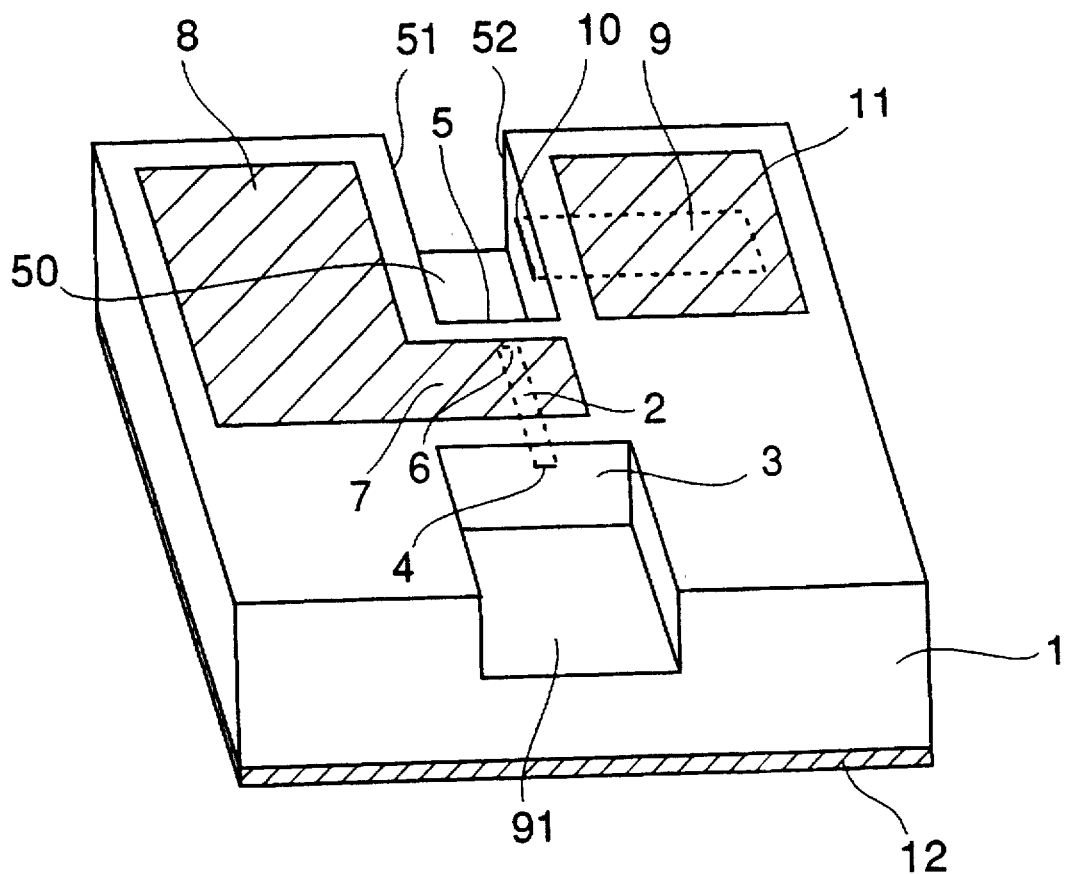
FIG. 6 is a perspective view illustrating a semiconductor laser device according to a variation of the fifth embodiment.

While in this embodiment the cross-sectional configuration of the groove 91 is a semicircular, it may be V-shaped or square. As shown in FIG. 6, when the pair of sides of the groove 91 are perpendicular to the surface of the substrate 1 and a bottom of the groove 91 is flattened to have the same height as the bottom of the groove 50, the groove 91 can be formed simultaneously with the pair of the laser beam emitting facets 3 and 5 and the light responsive surface 10 of the photodiode, by a dry etching process such as RIE (reactive ion etching) and RIBE (reactive ion beam etching), shortening the fabricating process.

Embodiment 6

Figure 7:
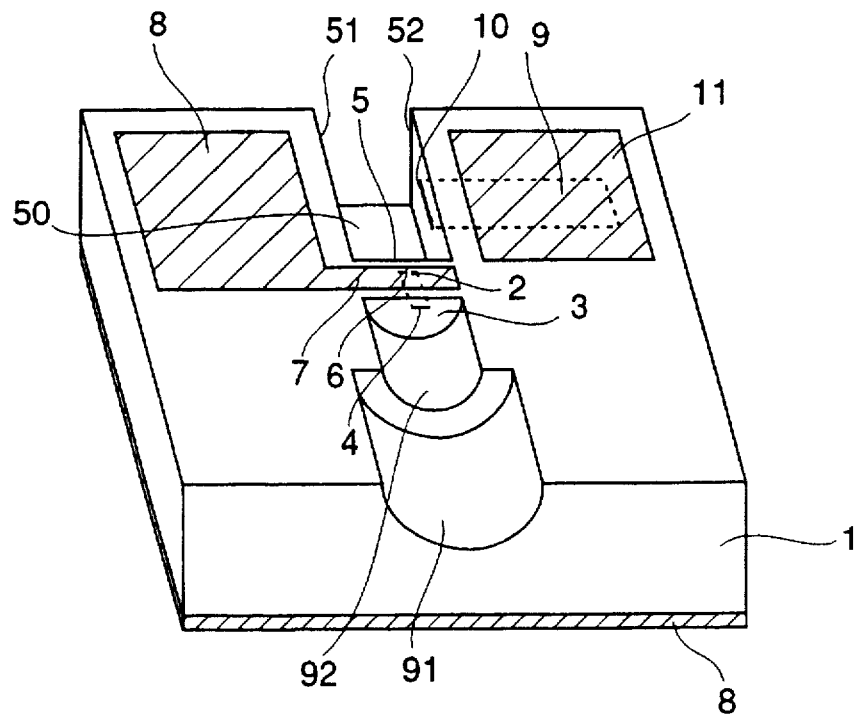
FIGS. 7(a) and 7(b) are a perspective view illustrating a semiconductor laser device according to a sixth embodiment of the present invention and a top view thereof.
Figure 7:
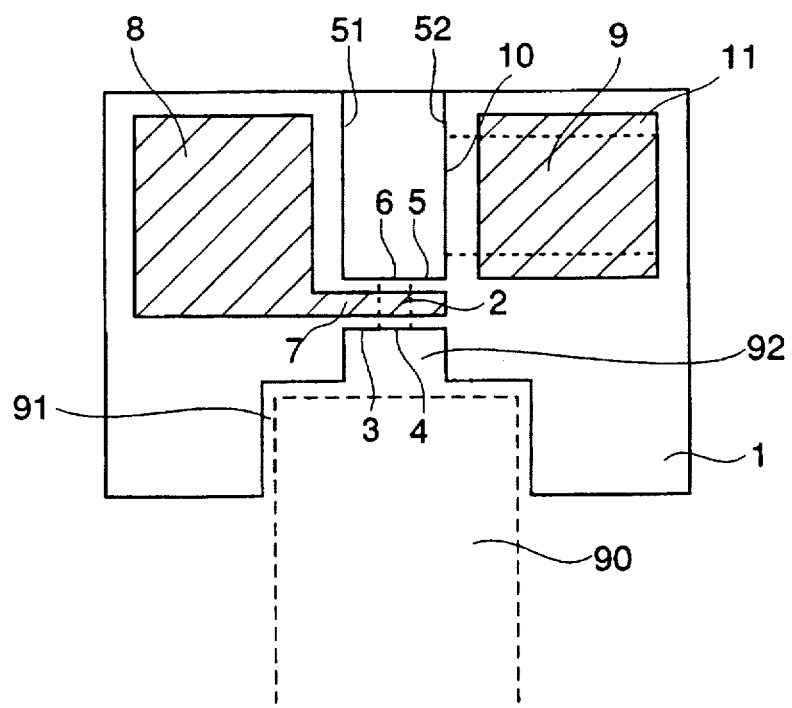

FIG. 7(a) is a perspective view illustrating a semiconductor laser device according to a sixth embodiment of the present invention and FIG. 7(b) is a top view thereof. In FIGS. 7(a) and 7(b), the same reference numerals as in FIGS. 5(a) and 5(b) designate the same or corresponding parts. Reference numeral 92 designates a groove for preventing the optical fiber or optical waveguide 90 from contacting the front side laser beam emitting facet 3.

In this sixth embodiment, a groove 92 is provided between the front side laser beam emitting facet 3 of the semiconductor laser 2 and the groove 91 for positioning the optical fiber or optical waveguide. The width of the groove 92 is smaller than an outer diameter of the optical fiber or optical waveguide 90 positioned in the groove 91. For example, when positioning a fiber having a spherical top, that width is about 40–50 μm. In addition, since the length of the groove 92 has an influence on the separation of the front side laser beam emitting facet 3 of the semiconductor laser and the optical fiber or optical waveguide 90, the length should be as short as possible in order to improve the coupling efficiency of the laser beam. Preferably, the length is about 10 μm. The optical fiber or optical waveguide 90 is arranged along the groove 91 and it is fixed in the groove 91 with solder.

Since the groove 92 having a narrower width than the optical fiber or optical waveguide 90 is disposed between the groove 91 and the front side laser beam emitting facet 3, a tip of the optical fiber or optical waveguide 90 does not contact the front side laser beam emitting facet 3 by accident, damaging the facet 3.

According to the sixth embodiment, a groove 92 for preventing the optical fiber or optical waveguide 90 from contacting the front side laser beam emitting facet 3 is provided between the front side laser beam emitting facet 3 of the semiconductor laser 2 and the groove 91. While in this embodiment the cross-sectional configuration of the groove 92 is a semicircle, it may be V-shaped or square.

Figure 8:
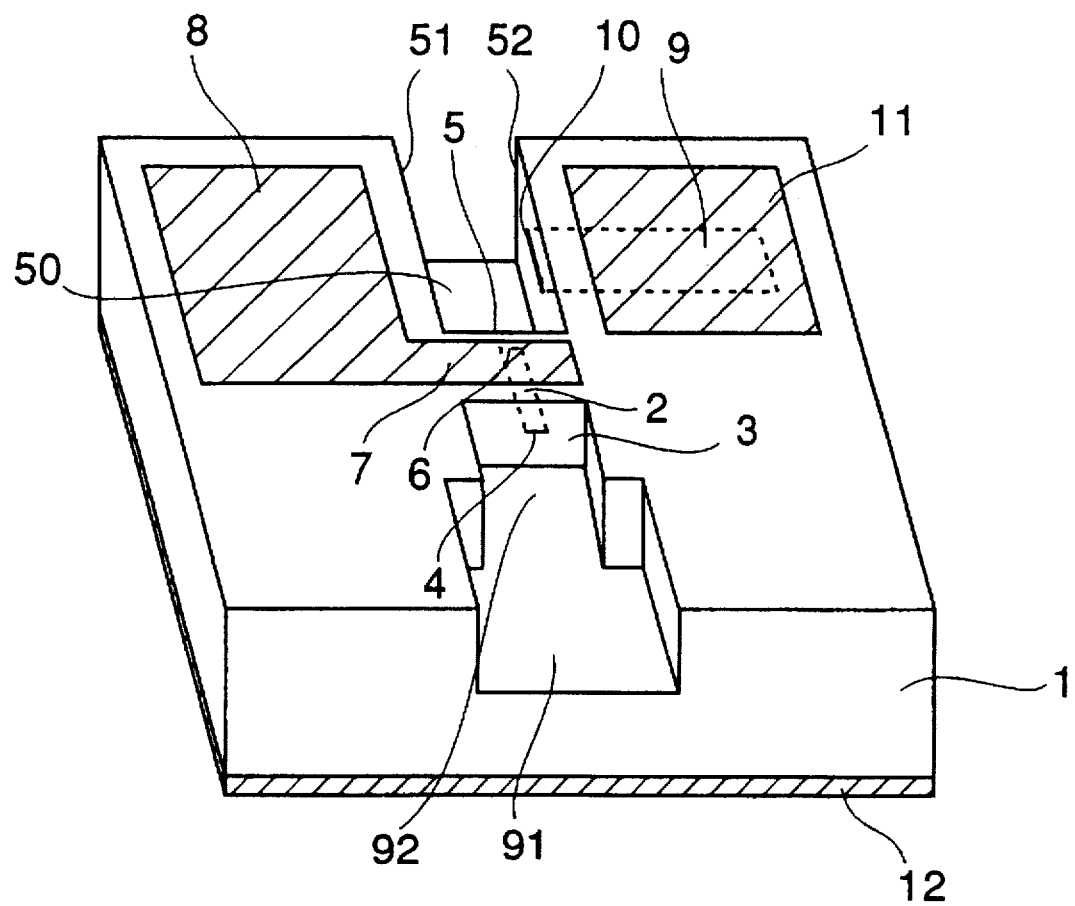
FIG. 8 is a perspective view illustrating a semiconductor laser device according to a variation of the sixth embodiment.

Further, as shown in FIG. 8, when the pair of sides of the groove 91 and the pair of sides of the groove 92 are respectively perpendicular to the surface of the substrate 1 and the bottoms of the grooves 91 and 92 are flattened at the same position as the bottom of the groove 50, respectively, the grooves 91 and 92 can be formed simultaneously with the pair of the laser beam emitting facets 3 and 5 and the light responsive surface 10 of the photodiode, by a dry etching process such as RIE (reactive ion etching) and RIBE (reactive ion beam etching), shortening the fabricating process.

While in the fifth and sixth embodiments a semiconductor laser device emitting the laser beam incident on the optical fiber or optical waveguide according to the first embodiment of the invention is described, a semiconductor laser device according to the second embodiment and semiconductor laser array devices according to the third and fourth embodiments may be applied with the same effects as in the other embodiments.

What is claimed is:

1. A semiconductor laser device comprising:

a semiconductor substrate having a surface;

a semiconductor laser having a pair of facets including emitting points, disposed on said semiconductor substrate, and producing, from one of the emitting points, a laser beam having an optical axis; and a photodiode having a light responsive surface lying in a plane parallel to the optical axis of the laser beam, located to intersect the laser beam, and disposed on the semiconductor substrate wherein the pair of facets and the light responsive surface are perpendicular to the surface of the semiconductor substrate, and the light responsive surface of the photodiode is disposed so that light of the laser beam reflected by the light responsive surface does not return to the emitting points of the laser facets.

2. The semiconductor laser device of claim 1, including a groove which passes the laser beam emitted from one of the pair of facets disposed in the substrate and having a pair of sides disposed parallel to the optical axis of the laser beam, and the light responsive surface of the photodiode is disposed on one of the pair of sides of the groove.

3. The semiconductor laser device of claim 1, including a groove in the semiconductor substrate for positioning an optical fiber or optical waveguide on which a laser beam emitted from one of the pair of facets is incident.

4. The semiconductor laser device of claim 3, wherein the groove for positioning has a width narrower than a radius of the optical fiber or narrower than a width of the optical waveguide in the vicinity of the laser beam emitting facet of the semiconductor laser and a width wider than the radius of the optical fiber or the width of the optical waveguide at a position spaced from the light emitting facet of the laser beam.

5. A semiconductor laser array device comprising:

a semiconductor substrate;

a plurality of semiconductor laser devices arranged in a line on the semiconductor substrate so that optical axes of laser beams emitted from the respective semiconductor laser devices are parallel, each of said semiconductor laser devices comprising:

a semiconductor laser having a pair of facets;

a photodiode having a light responsive surface on which a laser beam emitted from one of the pair of facets is incident, and disposed on the semiconductor substrate wherein the pair of facets and the light responsive surface are perpendicular to the surface of the semiconductor substrate, and the light responsive surface of the photodiode is disposed in a plane parallel to the optical axis of the laser beam to intersect light of the laser beam in the plane; and a groove that passes the laser beam emitted from one of the pair of facets and located in the substrate with a pair of sides parallel to the optical axis of the laser beam, the light responsive surface of the photodiode being disposed on one of the pair of sides of the groove.

6. A semiconductor laser device comprising:

a semiconductor substrate having a surface;

a semiconductor laser having a pair of facets including emitting points, disposed on said semiconductor substrate, and producing, from one of the emitting points, a laser beam having an optical axis; and a photodiode having a light responsive surface lying in a plane parallel to the optical axis of the laser beam, located to intersect the laser beam, and disposed on the semiconductor substrate wherein the pair of facets and the light responsive surface are perpendicular to the surface of the semiconductor substrate, the light responsive surface is located at a position opposite the facet from which the laser beam is emitted, the light responsive surface has a concave surface that does not reflect the laser beam emitted from the semiconductor laser to the light emitting point of the semiconductor laser, and a point on the light responsive surface distant from the facet from which the laser beam is emitted is off the optical axis of the laser beam.

7. A semiconductor laser array device comprising:

a semiconductor substrate;

a plurality of semiconductor laser devices arranged in a line on the semiconductor substrate so that optical axes of laser beams emitted from the respective semiconductor laser devices are parallel, each of said semiconductor laser devices comprising:

a semiconductor laser having a pair of facets; and a photodiode having a light responsive surface to which a laser beam emitted from one of the pair of facets is incident, and disposed on the semiconductor substrate, the light responsive surface is disposed opposite the facet from which the laser beam is emitted, the light responsive surface having a concave configuration, and a point on the light responsive surface most distant from the facet that emits the laser beam is off the optical axis of the laser beam.

* * * * *

UNITED STATES PATENT AND TRADEMARK OFFICE
CERTIFICATE OF CORRECTION

PATENT NO. :     5,617,439
DATED      :     April 1, 1997
INVENTOR(S):     Kakimoto It is certified that error appears in the above-identified patent and that said Letters Patent is hereby corrected as shown below:

Column 14, Line 21, after "surface" insert --most--.

Signed and Sealed this

Twelfth Day of August, 1997

*Attest:*

BRUCE LEHMAN

*Attesting Officer*     Commissioner of Patents and Trademarks